United States Patent
Schwandner

(10) Patent No.: US 9,308,619 B2
(45) Date of Patent: Apr. 12, 2016

(54) METHOD FOR THE DOUBLE-SIDE POLISHING OF A SEMICONDUCTOR WAFER

(71) Applicant: Siltronic AG, Munich (DE)

(72) Inventor: Juergen Schwandner, Garching, DE (US)

(73) Assignee: SILTRONIC AG, Munich (DE)

( * ) Notice: Subject to any disclaimer, the term of this patent is extended or adjusted under 35 U.S.C. 154(b) by 0 days.

(21) Appl. No.: 14/472,457

(22) Filed: Aug. 29, 2014

(65) Prior Publication Data

US 2014/0370786 A1    Dec. 18, 2014

Related U.S. Application Data

(62) Division of application No. 13/602,455, filed on Sep. 4, 2012, now abandoned.

(30) Foreign Application Priority Data

Sep. 15, 2011 (DE) .......................... 10 2011 082 777

(51) Int. Cl.
*B24B 37/04* (2012.01)
*B24B 37/08* (2012.01)
*B24B 37/16* (2012.01)
*B24B 37/26* (2012.01)
*H01L 21/304* (2006.01)

(52) U.S. Cl.
CPC ............... *B24B 37/08* (2013.01); *B24B 37/042* (2013.01); *B24B 37/16* (2013.01); *B24B 37/26* (2013.01); *H01L 21/304* (2013.01)

(58) Field of Classification Search
CPC ...... B24B 37/08; B24B 37/042; B24B 37/16; B24B 37/26; B24B 21/304
USPC ........... 451/41, 268, 269, 286, 290, 294, 262, 451/60, 446
See application file for complete search history.

(56) References Cited

U.S. PATENT DOCUMENTS 2,577,937 A * 12/1951 Barnes ..................... B24B 7/24
                                                                                                                                        451/261
3,691,694 A      9/1972 Goetz et al.
(Continued)

FOREIGN PATENT DOCUMENTS

CN          101014446 A      8/2007
DE          10007390 A1      10/2000
(Continued)

*Primary Examiner* — George Nguyen
(74) *Attorney, Agent, or Firm* — Leydig, Voit & Mayer, Ltd.

(57) ABSTRACT

A method of simultaneous double-side polishing of at least one semiconductor material wafer includes disposing each wafer in a respective suitably dimensioned cutout in a carrier plate having a front and rear side. The at least one wafer is polished between an upper polishing plate covered with a first polishing pad and a lower polishing plate covered with a second polishing pad while supplying a polishing agent. The polishing agent is supplied on the front and rear side of the wafer through openings in the upper and lower polishing pads and the upper and lower polishing plates. Each polishing pad has an inner circular region and outer ring shaped region where the quantity of polishing agent emerging from openings in the working gap per unit time in the inner circular region of the polishing pad is different from the quantity that emerges from openings in the outer ring-shaped region.

6 Claims, 2 Drawing Sheets

(56) References Cited

U.S. PATENT DOCUMENTS

| | | | |
|---|---|---|---|
| 4,502,252 A * | 3/1985 | Iwabuchi | B24B 37/345 451/269 |
| 4,739,589 A | 4/1988 | Brehm et al. | |
| 5,193,316 A * | 3/1993 | Olmstead | B24B 37/30 451/285 |
| 5,422,316 A * | 6/1995 | Desai | B24B 37/013 156/345.14 |
| 5,582,534 A | 12/1996 | Shendon et al. | |
| 5,690,540 A * | 11/1997 | Elliott | B24B 37/26 451/288 |
| 5,942,445 A * | 8/1999 | Kato | C30B 33/00 257/E21.214 |
| 6,062,949 A * | 5/2000 | Yashiki | B24B 37/005 451/10 |
| 6,089,959 A * | 7/2000 | Nagahashi | B24B 37/08 451/262 |
| 6,135,856 A | 10/2000 | Tjaden et al. | |
| 6,135,865 A | 10/2000 | Beardsley et al. | |
| 6,142,859 A * | 11/2000 | Ross | B24B 37/08 451/268 |
| 6,168,506 B1 * | 1/2001 | McJunken | B24B 37/08 451/259 |
| 6,196,907 B1 * | 3/2001 | Kahn | B24B 37/08 451/262 |
| 6,206,765 B1 * | 3/2001 | Sanders | B24B 37/08 451/255 |
| 6,210,259 B1 * | 4/2001 | Malkin et al. | B24B 37/08 451/166 |
| 6,299,514 B1 | 10/2001 | Boller | |
| 6,299,515 B1 * | 10/2001 | Beardsley | B24B 37/16 451/285 |
| 6,540,590 B1 | 4/2003 | Kajiwara et al. | |
| 6,582,279 B1 * | 6/2003 | Fox | B24B 37/08 156/345.12 |
| 6,645,061 B1 * | 11/2003 | Bennett | B24B 37/26 451/527 |
| 6,685,548 B2 | 2/2004 | Chen et al. | |
| 6,692,338 B1 * | 2/2004 | Kirchner | B24B 37/26 257/E21.23 |
| 6,733,367 B1 * | 5/2004 | Nguyen | B24B 37/30 451/28 |
| 6,733,368 B1 * | 5/2004 | Pan | B24B 37/042 451/177 |
| 7,008,308 B2 * | 3/2006 | Bjelopavlic | B24B 37/28 451/269 |
| 7,267,610 B1 | 9/2007 | Elmufdi et al. | |
| 8,348,720 B1 * | 1/2013 | Ko | B24B 37/042 451/285 |
| 8,398,461 B2 * | 3/2013 | Wang | B24B 37/26 451/285 |
| 2001/0014570 A1 | 8/2001 | Wenski et al. | |
| 2001/0044263 A1 * | 11/2001 | Andideh | B24B 37/26 451/51 |
| 2002/0052116 A1 * | 5/2002 | Vepa | B24B 37/08 438/692 |
| 2002/0077039 A1 | 6/2002 | Wenski et al. | |
| 2002/0102931 A1 * | 8/2002 | Ohkuma et al. | B24B 7/17 451/262 |
| 2003/0199234 A1 * | 10/2003 | Chen | B24D 18/00 451/41 |
| 2004/0014413 A1 * | 1/2004 | Kawahashi | B24B 37/26 451/527 |
| 2004/0082273 A1 | 4/2004 | Moriya | |
| 2004/0192171 A1 * | 9/2004 | Koike | B24B 37/042 451/5 |
| 2004/0266326 A1 | 12/2004 | Shiho et al. | |
| 2005/0136804 A1 | 6/2005 | Miyake et al. | |
| 2006/0128276 A1 | 6/2006 | Horiguchi et al. | |
| 2006/0154574 A1 * | 7/2006 | Elmufdi | B24B 37/26 451/41 |
| 2006/0178089 A1 | 8/2006 | Ueno | |
| 2006/0270325 A1 * | 11/2006 | Choi | B24B 37/26 451/285 |
| 2007/0190909 A1 * | 8/2007 | Muldowney | B24B 37/24 451/41 |
| 2007/0197147 A1 * | 8/2007 | Rondum et al. | B24B 21/04 451/285 |
| 2007/0205112 A1 | 9/2007 | Kodera et al. | |
| 2008/0064302 A1 * | 3/2008 | Fujitani | B24B 37/26 451/41 |
| 2008/0182489 A1 | 7/2008 | Muldowney | |
| 2008/0305722 A1 | 12/2008 | Roettger et al. | |
| 2009/0029552 A1 | 1/2009 | Schwandner et al. | |
| 2009/0042487 A1 * | 2/2009 | Tokura | B24B 49/16 451/41 |
| 2009/0124175 A1 * | 5/2009 | Ueno | B24B 37/08 451/57 |
| 2009/0311948 A1 * | 12/2009 | Hashii | B24B 7/17 451/44 |
| 2011/0014858 A1 * | 1/2011 | Tsai | B24B 37/26 451/527 |
| 2011/0076754 A1 * | 3/2011 | Frey | B01D 21/0087 435/283.1 |
| 2012/0100783 A1 | 4/2012 | Itoyama et al. | |
| 2012/0252319 A1 * | 10/2012 | Fujihira | G04R 20/10 451/8 |

FOREIGN PATENT DOCUMENTS

| | | |
|---|---|---|
| DE | 10004578 C1 | 7/2001 |
| DE | 102007040546 A1 | 3/2008 |
| DE | 102007035266 A1 | 1/2009 |
| EP | 0208315 A1 | 1/1987 |
| EP | 1177859 A2 | 2/2002 |
| EP | 1676672 A1 | 7/2006 |
| JP | H 01153273 A | 6/1989 |
| JP | 08039422 A | 2/1996 |
| JP | H 9155726 A | 6/1997 |
| JP | H 11233462 A | 8/1999 |
| JP | 3266340 B2 | 3/2002 |
| JP | 2003117805 A | 4/2003 |
| JP | 2004034176 A | 2/2004 |
| JP | 2004071985 A | 3/2004 |
| JP | 2004142040 A2 | 5/2004 |
| JP | 2004291115 A | 10/2004 |
| JP | 2005158798 A | 6/2005 |
| JP | 2005177897 A | 7/2005 |
| JP | 2006159383 A2 | 6/2006 |
| JP | 2006186088 A | 7/2006 |
| JP | 2008062367 A | 3/2008 |
| JP | 2009125873 A | 6/2009 |
| JP | 2010264537 A | 11/2010 |
| JP | 2011005563 A | 1/2011 |
| KR | 20010002467 A | 1/2001 |
| KR | 1020110099432 A | 9/2011 |
| WO | WO 2006020153 A2 | 2/2006 |

\* cited by examiner

METHOD FOR THE DOUBLE-SIDE POLISHING OF A SEMICONDUCTOR WAFER

CROSS REFERENCE TO RELATED APPLICATIONS

This application is a divisional of U.S. patent application Ser. No. 13/602,455, filed Sep. 4, 2012, which claims priority to German Patent Application No. DE 10 2011 082 777.3, filed Sep. 15, 2011. The entire disclosure of both applications is incorporated by reference herein.

FIELD

The invention relates to a method for the double-side polishing of a semiconductor wafer.

BACKGROUND

At the present time, predominantly polished or epitaxially coated silicon wafers having a diameter of 300 mm are used for the most demanding applications in the electronics industry. Silicon wafers having a substrate diameter of 450 mm are in development.

However, the enlargement of the substrate diameter is accompanied by major, in some instances also totally new, hitherto unknown technical problems.

Many processing steps, whether they are of purely mechanical (sawing, grinding, lapping), chemical (etching, cleaning) or chemical-mechanical nature (polishing), and also the thermal processes (epitaxial coating, annealing), require thorough revision, in part also with regard to the machines used therefor and the working materials.

Semiconductor wafers, after being sliced from a single crystal (ingot) composed of semiconductor material, are processed further in a multiplicity of process steps. After the grinding, cleaning and etching steps, in accordance with the prior art, the surface of the semiconductor wafers is smoothed by one or a plurality of polishing steps.

Obtaining a sufficiently good edge geometry and the surface flatness (nanotopology) are particularly critical in the manufacture of semiconductor wafers.

The nanotopology is usually expressed as height fluctuation PV (="peak to valley"), relative to square measurement windows having an area of 2 mm×2 mm.

The final nanotopology of a semiconductor wafer is generally produced by means of a polishing process.

In the case of single-side polishing (SSP), semiconductor wafers are held during processing on the rear side on a support plate by means of cement, a vacuum or by means of adhesion and are subjected to polishing on the other side.

In the case of double-side polishing (DSP), semiconductor wafers are inserted loosely into a thin carrier plate and are polished on the front and rear sides simultaneously in a "freely floating" manner between an upper and a lower polishing plate each covered with a polishing pad. This polishing method is effected with the supply of a polishing agent slurry, usually based on a silica sol.

The prior art likewise discloses polishing using fixedly bonded abrasives ("Fixed Abrasive Polishing", FAP), wherein the semiconductor wafer is polished on a polishing pad which, in contrast to other polishing pads, contains an abrasive substance bonded in the polishing pad ("Fixed Abrasive" or FA pad). The German Patent Application DE 10 2007 035 266 A1 describes a method for polishing a substrate composed of silicon material, using FA pads.

After DSP or FAP, the front sides of the semiconductor wafers are generally polished in a haze-free manner. As is usually effected using a softer polishing pad with the aid of an alkaline polishing sol. In the literature, this step is often designated as chemical mechanical polishing (CMP). CMP methods are described, for example, in US 2002-0077039 and in US 2008-0305722.

By comparison with single-side polishing (SSP), simultaneous double-side polishing (DSP) of semiconductor wafers is not only more economic, but higher flatness with regard to the surfaces of the semiconductor wafers is obtained as well.

Double-side polishing is described, for example, in U.S. Pat. No. 3,691,694. A suitable double-side polishing machine is described in DE 100 07 390 A1. In accordance with one embodiment of double-side polishing as described in EP 0 208 315 B1, semiconductor wafers in carrier plates composed of metal or plastic, which have suitably dimensioned cutouts, are moved between two rotating polishing plates covered with a polishing pad in the presence of a polishing agent (polishing sol) on a path predetermined by the machine and process parameters and are thereby polished (in the literature, carrier plates are designated as "templates").

The double-side polishing step is usually carried out using a polishing pad composed of homogeneous, porous polymer foam having a hardness of 60 to 90 (Shore A), as described for example in DE 100 04 578 C1, where it is also disclosed that the polishing pad adhering to the upper polishing plate is pervaded by a network of channels and the polishing pad adhering to the lower polishing plate has a smooth surface without such a texture. This measure is intended firstly to ensure a homogeneous distribution of the polishing agent used during polishing and secondly to prevent the semiconductor wafer from adhering to the upper polishing pad when the upper polishing plate is raised after polishing has finished.

The upper polishing pad comprises a regular chequered arrangement of channels having a segment size of 5 mm×5 mm to 50 mm×50 mm and a channel width and depth of 0.5 to 2 mm. This arrangement is used to effect polishing at a polishing pressure preferably of 0.1 to 0.3 bar. The silicon removal rate is preferably between 0.1 and 1.5 μm/min and particularly preferably between 0.4 and 0.9 μm/min.

However, a procedure in accordance with DE 100 04 578 C1 results in an asymmetrical polishing removal at the outer edge of the semiconductor wafer at the opposite sides (rear side and front side).

A further cause of locally different polishing removals in the case of double-side polishing in accordance with the prior art is the fact that abraded material (semiconductor material, for example silicon or silicon oxide), removed from the surfaces of the semiconductor wafers in the polishing process covers (deposits on) the polishing pad surfaces to in part different extents. In particular, the regions of the polishing pad surface which come into contact with the surfaces of the semiconductor wafers during the polishing process the most often statistically in a defined time period are covered with abraded material. A ring-shaped area with abraded material often forms on the polishing pad surface.

The formation of regions covered with abraded material on the polishing pad surface is additionally fostered by a non-uniform polishing agent distribution in the working gap between polishing pad and carrier plate.

The areas of the polishing pad which are covered with abraded material constitute regions in which the pad is altered in terms of its texture and in terms of its composition near the surface. These regions therefore have different properties with regard to the polishing result in comparison with the regions which are affected to a lesser extent or not at all by covering with abraded material.

As polishing pad covering increases, it becomes more and more difficult to control the polishing machines in such a way that flat wafers having good geometry values (GBIR, wafer shape, edge roll-off) are produced. Furthermore, it is necessary to reckon with an increase in the micro roughness (haze values) of the wafers. The risk of polishing scratches and increased LLS values on the polished wafer surfaces likewise increases in a similar manner.

Regular polishing pad conditioning that becomes necessary as a result reduces the lifetime of the polishing pads (wear) and additionally adversely impairs—on account of the mechanical action on the polishing pad and the associated change in the polishing pad (thickness, pad structure, . . . )—the wafer geometry and form.

A further cause of the non-uniform polishing removal is, inter alia, a polishing agent distribution effected non-uniformly on the polishing pad and, as a consequence thereof, a non-uniform wetting of the surfaces to be polished with polishing agent, or application of polishing agent to said surfaces.

In accordance with the prior art, the polishing agent distribution is effected by gravitational force and centrifugal force. The polishing agent is introduced from above into the working gap between polishing pad and carrier plate and flows on account of the gravitational force inter alia through the cutouts for the semiconductor wafers in the carrier plate also onto the lower polishing pad. In this case, the polishing agent distribution is fostered by the rotational movement of the carrier plates and of the polishing plates covered with the polishing pads.

The uniform polishing agent distribution is impeded by the carrier plate, in particular with regard to the polishing pad regions lying below the carrier plate. In order to improve the polishing agent distribution, US 2006-178089 A describes a carrier plate having a multiplicity of round openings through which the polishing agent reaches the lower polishing pad.

The teaching of EP 1 676 672 A1 includes improving the supply of polishing agent to the lower polishing plate by at least 15% of the area of the carrier plate being occupied by holes that provide for the polishing agent a passage to the lower polishing plate.

However, these additional "polishing agent cutout" in the circular carrier plates reduce the area moment of inertia thereof and, as a consequence thereof, also the resistance thereof to torsion. That is disadvantageous since the risk of carrier plate warping is thereby increased. The warping of the carrier plate can lead to pad damage, reduced pad lifetime, particle generation, polishing scratches through to wafer fracture and damage to the installation.

On account of the further increasing surface area in semiconductor wafers of future generations, for example having a diameter of 450 mm, the uniform polishing agent distribution (application of polishing agent) can be realized only to a limited extent during the polishing process in accordance with the prior art.

SUMMARY

In an embodiment, the present invention provides method of simultaneous double-side polishing of at least one semiconductor material wafer including disposing each wafer in a respective suitably dimensioned cutout in a carrier plate having a front and rear side. The at least one wafer is polished between an upper polishing plate covered with a first polishing pad and a lower polishing plate covered with a second polishing pad while supplying a polishing agent. The polishing agent is supplied on the front and rear side of the wafer through openings in the upper and lower polishing pads and the upper and lower polishing plates. Each polishing pad has an inner circular region and outer ring shaped region where the quantity of polishing agent emerging from openings in the working gap per unit time in the inner circular region of the polishing pad is different from the quantity that emerges from openings in the outer ring-shaped region.

BRIEF DESCRIPTION OF THE DRAWINGS

Exemplary embodiments of the present invention are described in more detail below with reference to the drawings, in which.

DETAILED DESCRIPTION

In an embodiment, the present invention provides a method that promotes the uniform application of polishing agent to the polishing pad surfaces during the simultaneous double-side polishing of semiconductor wafers, without impairing the stability of the carrier plate.

In an embodiment, the present invention provides a method for the simultaneous double-side polishing of at least one wafer composed of semiconductor material which is situated in a suitably dimensioned cutout in a carrier plate and which has a front side and a rear side, and the double-side polishing is effected between an upper polishing plate covered with a first polishing pad and a lower polishing plate covered with a second polishing pad, with a polishing agent being supplied, wherein the surfaces of the first (upper) and of the second (lower) polishing pad are in each case interrupted by at least one channel-shaped depression running spirally from the center to the edge.

FIG. 1 shows spiral forms used in embodiments of the method according to the invention: (a) logarithmic spiral, (b) Archimedes' spiral, (c) Fermat's spiral, (d) triple spiral.

Figure 2:
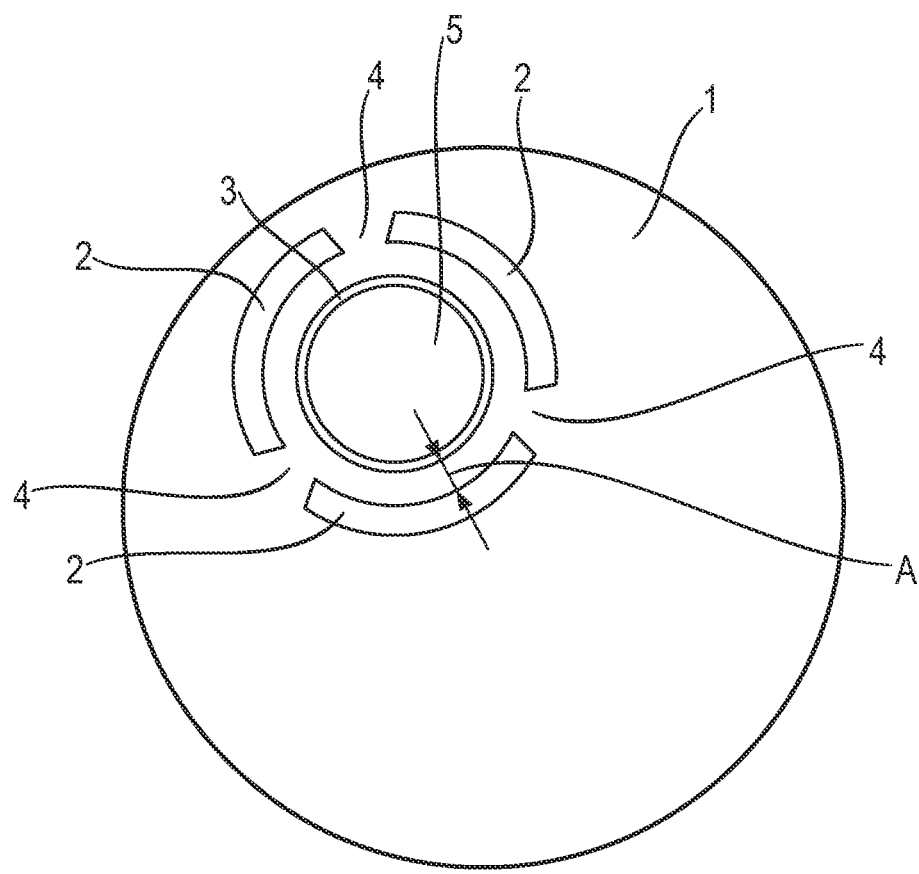
FIG. 2 shows an embodiment of a carrier plate including polishing agent passages.

FIG. 2 shows a preferred embodiment of the carrier plate (1) modified according to the invention with the segmented polishing agent passages (2) interrupted by the three webs (4), and the suitably dimensioned cutouts (3) for the wafers (5) composed of semiconductor material, wherein the cutouts (3) for the wafers (5) composed of semiconductor material are surrounded by the segmented polishing agent passages (2) at a distance A. In this preferred embodiment, the webs (4) are arranged such that the respective centers of the three webs (4) are at an angle of 120° with respect to one another.

The process includes not just a partial aspect restricted to a specific technical component or an individual process-technological aspect (e.g. of individual process parameters), but encompasses associated process features. These process features are subdivided into 1) Polishing pads having a specific surface structure,
2) Reconfiguration of the carrier plates for wafer accommodation and
3) Polishing agent supply effected on both sides.

In an embodiment, the process for the simultaneous double-side polishing (DSP) of a wafer composed of semiconductor material uses a polishing agent made of a silica sol, a slurry comprising colloidally distributed particles having a size of 20 to 50 nm.

The polishing agent distribution during DSP is influenced, inter alia, by the properties of the polishing pad surface (working surface) which comes into contact in a material-removing manner with the front and/or rear side of the semiconductor wafer during the polishing process. Both the absorbency for the polishing agent and the structure (channels, depressions, grooves) influence the polishing agent distribution during DSP, as is described for example in DE 100 04 578 C1.

Circular polishing pads composed of homogeneous, porous polymer foam having a hardness of 60 to 90 (Shore A) can be used for the method according to the invention.

In a first exemplary embodiment of the method according to the invention for the simultaneous double-side polishing of wafers composed of semiconductor material, the upper and the lower polishing plate are covered with circular polishing pads, the working surface of which is provided with at least one channel (depression, groove) running spirally.

A spiral channel is a depression that runs circularly around a start point and depending on the running direction (orientation), leads away from said point or approaches said point. The distance between two spiral channels (distance W between the turns) can be constant (Archimedes' spiral (FIG. 1b)) or—as viewed from the start point—can become continuously greater (logarithmic spiral (FIG. 1a)).

Figure 1A:
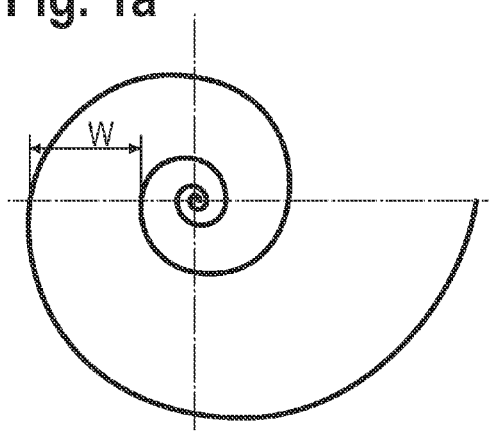
FIGS. 1a-1d show spiral forms used in embodiments of a method according to the invention.
Figure 1B:
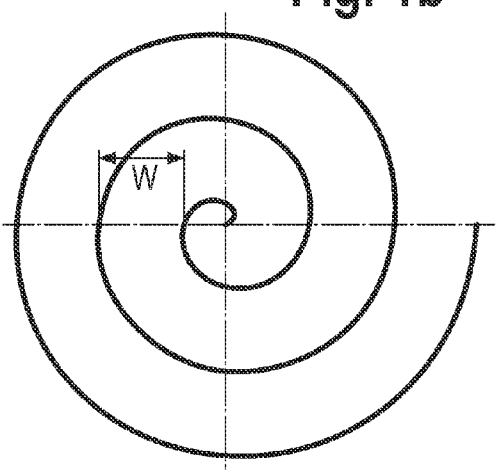
Figure 1C:
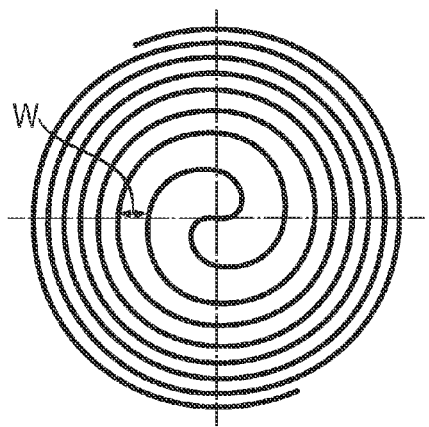
Figure 1D:
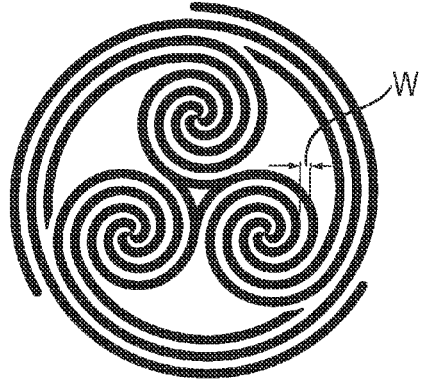

A special form of spiral is the triple spiral, which consists of three Archimedes' spirals arranged circularly around a midpoint and whose lines, after a finite number of turns, form a circular form enclosing the three spirals (FIG. 1d).

For the method according to embodiments of the invention for the simultaneous double-side polishing of wafers composed of semiconductor material, use is preferably made of polishing pads having at least one channel running spirally from the inner portion (middle or center of the polishing pad) toward the outer portion (edge of the polishing pad) on the working surface, characterized in that the distance W between the turns of the at least one spiral channel becomes continuously greater from the inner portion toward the outer portion (logarithmic spiral, FIG. 1a).

For the method according to embodiments of the invention for the simultaneous double-side polishing of wafers composed of semiconductor material, preference is likewise given to using polishing pads having channels running spirally from the inner portion toward the outer portion on the working surface, characterized in that the distance W between the turns of the channels becomes continuously smaller from the inner portion toward the outer portion (Fermat's spiral, FIG. 1c).

Particularly preferably, for the method according to the invention for the simultaneous double-side polishing of wafers composed of semiconductor material, use is made of polishing pads having channels running spirally from the inner portion toward the outer portion on the working surface, characterized in that the distance W between the turns of the channels is constant (Archimedes' spiral, FIG. 1b).

The distance W between turns between two spiral channels on the polishing pad surface is chosen such that—independently of the diameter of the circular polishing pad—the spiral has at least 3 turns.

Preferably, a spirally arranged channel running from the center of the polishing pad (start point) spirally to the edge region of the polishing pad is situated in the surface of the polishing pad. In this case, the end point of this spiral depression can reach as far as the edge of the polishing pad.

In a likewise preferred embodiment of the method according to the invention, two or more spirally arranged channels running from the center of the polishing pad (start point) to the edge thereof are situated in the surface of the polishing pad.

In this embodiment, particular preference is given to polishing pads whose working surface has in an inner circular region around the midpoint of the circular polishing pad having a radius R three channels running spirally from the center of the polishing pad toward the edge, wherein, in a ring-shaped outer region (edge region) of the polishing pad surface, having a thickness D, the three spiral channels merge into a circular course (triple spiral, FIG. 1d).

The radius R of the inner circular region of the polishing pad surface is preferably greater than or equal to two thirds of the radius of the circular polishing pad. In this case, the thickness D of the outer ring-shaped region is preferably less than or equal to one third of the radius of the circular polishing pad and results from the difference in the outer radius of the ring-shaped edge region minus the inner radius of the ring-shaped edge region.

The spiral channels have a preferred depth of 0.5-1.5 mm and a preferred width of 1-5 mm. Particularly preferably, the spiral channels have a depth of 0.7-1.0 mm and a width of 1.5-3 mm.

Preference is likewise given to an enlargement of the width of the spiral channels from the inner portion toward the outer portion, said enlargement running uniformly over the length of the channels from the start point to the end, wherein the width is preferably 2 mm at the beginning of the spiral channel (in the center of the circular polishing pad) and is preferably 4 mm at the end of the spiral channel (in the edge region or at the edge of the circular polishing pad).

By virtue of the greater width of the spiral channel on the working surface of the polishing pad in comparison with the width of the spiral channel in the pad center, the distribution of the polishing agent is additionally optimized.

According to an embodiment of the invention, the polishing agent distribution in the working gap can also be effected by an enlargement of the depth from the inner portion toward the outer portion, said enlargement running uniformly over the length of the spiral channel from the start point to the end thereof, wherein the depth is preferably 0.5 mm at the beginning of the spiral channel (in the center of the circular polishing pad) and is preferably 1 mm at the end of the spiral channel (in the edge region or at the edge of the circular polishing pad).

The inner form of the spiral channel preferably has a half-round form (U-profile). A rectangular inner form of the spiral channel is likewise preferred.

The edge that arises between the polishing pad surface and the depression formed by the spiral channel is preferably rounded.

Preferably, the channels arranged spirally into the surfaces of the polishing pads are oriented in the same sense. The use of spiral channels oriented in the same sense in the polishing pad surface—and thus the use of fundamentally identical polishing pads—is possible since the polishing plates face one another with their end sides—and thus also the active polishing pad surfaces—and upper and lower polishing plates rotate oppositely (diametrically oppositely).

By virtue of the centrifugal force that arises upon the rotation of the working disks respectively covered with a polishing pad according to the invention, the polishing agent is transported in the spiral channels from the inner portion toward the outer portion and is distributed uniformly in the working gap formed by the distance between the two polishing pad surfaces.

For further optimization of the polishing agent distribution during the DSP, in accordance with the method according to the invention, in addition to the use of the working surfaces of the polishing pads that are provided with spiral channels according to the invention, the carrier plates serving for accommodating and guiding the semiconductor wafers can also be configured.

A carrier plate used during DSP consists, in accordance with the prior art, of a round disk having one or a plurality of suitably dimensioned cutouts (3) into each of which a wafer (5) composed of semiconductor material is inserted. In addition, carrier plates can have "polishing agent cutouts" through which the polishing agent introduced into the working gap from above passes to the lower polishing plate.

Independently of the respective embodiments of the method according to the invention, in the method according to the invention each wafer composed of semiconductor material is preferably placed into a suitably dimensioned round cutout in the carrier plate such that the front side of the wafer composed of semiconductor material is polished at the upper polishing pad.

In the second exemplary embodiment of the method according to the invention for the simultaneously double-side polishing of wafers composed of semiconductor material, modified carrier plates are used instead of the carrier plates in accordance with the prior art.

The carrier plate (1) modified according to the invention has at least one suitably dimensioned cutout (3) for accommodating a wafer (5) composed of semiconductor material, characterized in that the at least one suitably dimensioned cutout (3) is surrounded by at least one further cutout (2), acting as a polishing agent passage, at a distance A.

Preferably, the carrier plate (1) modified according to the invention has at least one suitably dimensioned circular cutout (3) for accommodating a wafer (5) composed of semiconductor material, characterized in that at least one circular cutout (3) is surrounded by three segmented cutouts (2) which have an identical size (relative to the area) and are separated by webs (4), with a distance among one another of in each case at most 110°, in a ring-shaped manner at a distance A from the circular cutout (3) (FIG. 2).

The preferred thickness of the segmented cutout (2), which results from the difference in the outer edge minus the inner edge, is 1-10 mm. Particularly preferably, the thickness of the segmented cutout (2) is 3-7 mm. The preferred distance A between the outer edge of the circular cutout (3) and the inner edge of the segmented cutouts (2) is constant and is 5 to 10 mm.

The segmented "polishing agent cutouts" (2) in the carrier plate (1) modified according to the invention do not influence the stability of the carrier plate.

In the carrier plate (1) modified according to the invention, a respective semiconductor wafer (5) can be inserted into a suitably dimensioned cutout (3) in the carrier plate (1) and positioned such that an inherent rotation of the semiconductor wafer (5) within the cutout (3) in the carrier plate (1) is possible during the polishing process.

In a further preferred embodiment of the carrier plate (1) modified according to the invention, the inherent rotation of the at least one semiconductor wafer (5) in the suitably dimensioned cutout (3) in the carrier plate (1) is prevented by the fixing of the semiconductor wafer (5) during the polishing process.

The fixing of the semiconductor wafer (5) in the suitably dimensioned cutout (3) in the carrier plate (1) can be effected, for example, with the aid of one or a plurality of so-called "notch fingers".

A "notch finger" is a protuberance for example in the suitably dimensioned cutout (3) in the carrier plate (1) which projects into a notch in the edge of the semiconductor wafer (5) and thus fixes the semiconductor wafer (5) in the cutout (3) in the carrier plate (1).

In the third exemplary embodiment of the method according to the invention for the simultaneous double-side polishing of wafers composed of semiconductor material, the polishing agent supply is effected simultaneously on the front side and on the rear side of the semiconductor wafer both through the upper and through the lower polishing plate.

For this purpose, the polishing agent supply is preferably effected in a pressurized manner through openings integrated in the polishing agent outlets of the two polishing plates such that the outlets terminate flush with the polishing plates.

Particularly preferably, the polishing agent supply is effected in a pressurized manner by means of nozzles integrated in the polishing agent outlets of the two polishing plates such that the nozzle outlets terminate flush with the polishing plates or end within the openings in the polishing plates.

The two circular polishing pads applied to the upper and lower polishing plates before the polishing process likewise have openings besides the spiral depressions, wherein the number and distribution of the openings on the polishing plate corresponds to the number and distribution of the openings in the polishing pad and the polishing pad is applied to the polishing plate in such a way that the polishing agent can pass through the openings from above and below into the working gap.

Preferably, the polishing agent outlets for the application of polishing agent are arranged circularly in the polishing plates and pads. Particularly preferably, the polishing agent outlets are arranged in an inner circular and an outer ring-shaped region, wherein the radius R of the inner circular region of the polishing plate or polishing pad is preferably greater than or equal to two thirds of the radius of the circular polishing plate or polishing pad.

For further optimization of the polishing agent distribution, the quantity of the polishing agent emerging from the nozzles into the working gap per unit time in an inner circular region of the polishing pad can preferably be higher than the quantity that emerges in the same time from the nozzles situated in the outer ring-shaped region. As a result, an "aquaplaning" effect as a result of an excessively high quantity of polishing agent in the working gap can be counteracted in a targeted manner.

The different quantities of polishing agent per unit time can be set, for example, by means of different nozzle cross sections, nozzle types or by means of nozzles driven individually by pumps.

The nozzles for the polishing agent supply or the openings in the polishing plate or polishing pad are preferably perpendicular to the surface of the polishing plate or polishing pad. Particularly preferably, the nozzles for the polishing agent supply or the openings in the polishing plate or in the polishing pad have an angle, relative to the polishing pad surface, of from 45° to less than or equal to both 90°, wherein the openings are present in the upper and in the lower polishing plate and also in the upper and in the lower polishing pad.

In order to prevent the silica sol particles from crystallizing out (gelation) in the nozzles or lines of the polishing agent supply, the nozzles are rinsed with water after the conclusion of the polishing process.

In order also to additionally optimize the polishing result with regard to homogenizing the polishing removal—a plane-parallel wafer initial geometry is a precondition here, however—the temperature of the polishing agent supplied ideally corresponds to the surface temperature of the polishing pads. This is achieved by corresponding temperature regulation of the polishing plates and of the polishing agent in accordance with the prior art. Preferably, the temperatures of the polishing agent and of the polishing plate lie in the range of 20° C. to 30° C., and especially preferably in a range of 23° C. to 27° C.

The method according to the invention for the simultaneous double-side polishing of wafers composed of semiconductor material can also be combined with an apparatus for polishing agent recycling. For this purpose, the used polishing agent, which emerges from the working gap via a lateral outlet, is prefiltered and collected in a container and replenished in a controlled manner with water, fresh polishing agent and KOH, and pumped back via a filter into the supply container for the polishing agent. In this case, temperature regulation ensures that the preferred temperatures of the polishing agent are maintained.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A method of simultaneous double-side polishing of at least one wafer composed of semiconductor material, the method comprising:

disposing each wafer in a respective suitably dimensioned cutout in a carrier plate having a front side and a rear side, wherein each wafer can be configured to rotate within each suitability dimensioned cutout and wherein each suitably dimensioned cutout in the carrier plate is surrounded by at least one segmented cutout at a distance A from the dimensioned cutout; and polishing the at least one wafer between an upper polishing plate covered with a first polishing pad and a lower polishing plate covered with a second polishing pad while supplying a polishing agent, wherein the polishing agent is supplied on a front side and a rear side of the semiconductor wafer in a pressurized manner, through openings present in the upper and the lower polishing pad and through openings present in the upper and in the lower polishing plate;

wherein each polishing pad has an inner circular region and an outer edge region formed by a ring-shape area where the quantity of the polishing agent emerging from the openings into a working gap per unit time in the inner circular region of each polishing pad is different from a quantity that emerges in the same time from the openings situated in the outer ring-shaped region.

2. The method as recited in claim 1, wherein each suitably dimensioned circular cutout in the carrier plate is surrounded by three segmented cutouts, each having an identical size and being separated from one another by webs, with a distance among one another of in each case at most 110°, in a ring-shaped manner at distance A from the circular cutout.

3. The method as recited in claim 1, wherein a rotation of each semiconductor wafer within the respective suitably dimensioned cutout in the carrier plate is prevented by the semiconductor wafer being fixed in the cutout.

4. The method as recited in claim 1, wherein an orientation of openings of the nozzles integrated in the polishing plate for the polishing agent supply or openings in the polishing pad, relative to the polishing pad surface, lie in an angular range of from 45° to 90°.

5. The method as recited in claim 1, wherein the quantity of the polishing agent emerging from the openings into the working gap per unit time in the inner circular region of the polishing pad is higher than a quantity that emerges in the same time from the openings situated in the outer ring-shaped region.

6. The method as recited in claim 1, wherein a front side of the at least one wafer is polished at the upper polishing pad.

* * * * *